United States Patent [19]

Senor

[11] Patent Number: 4,556,267

[45] Date of Patent: Dec. 3, 1985

[54] INTEGRATED CIRCUIT MOUNTING SOCKET

[75] Inventor: Ronald E. Senor, North Attleboro, Mass.

[73] Assignee: Texas Instruments Incorporated, Dallas, Tex.

[21] Appl. No.: 559,596

[22] Filed: Dec. 8, 1983

[51] Int. Cl.[4] .......................................... H01R 13/422
[52] U.S. Cl. ........................... 339/59 M; 339/17 CF; 339/217 S; 339/218 M; 339/258 P
[58] Field of Search ............ 339/17 CF, 59 R, 59 M, 339/59 L, 217 R, 217 S, 191 R, 191 M, 191 S, 192 R, 218 R, 218 M, 258 P

[56] References Cited

U.S. PATENT DOCUMENTS

| | | | |
|---|---|---|---|
| 2,329,464 | 9/1943 | Gaynor | 339/59 L |
| 3,671,813 | 6/1972 | Wilcox | 339/17 CF |
| 3,718,892 | 2/1973 | Burgess et al. | 339/217 S |
| 3,854,788 | 12/1974 | Goodman | 339/17 CF |
| 3,910,664 | 10/1975 | Pauza et al. | 339/17 CF |

Primary Examiner—Neil Abrams
Attorney, Agent, or Firm—John A. Haug; James P. McAndrews; Melvin Sharp

[57] ABSTRACT

A connector or socket for detachably mounting an integrated circuit unit on a printed circuit board has single beam contact members precisely located and secured in respective recesses in an electrically insulating body. The contact members are formed of a strip material and each has a spring beam part extending up from a base to loop over the base and a post part extending down from the opposite end of the base. The connector body recesses are open at their bottom end to receive the loop contact portions therein and have a integrally formed stop member projecting into the recesses at their bottom end which permits the beam part of the contact members to pass by during assembly of a contact member into its recess and then serves to limit downward movement of i.c. terminals and isolate the distal end portion of the i.c. terminals from solder material.

3 Claims, 10 Drawing Figures

INTEGRATED CIRCUIT MOUNTING SOCKET

BACKGROUND OF THE INVENTION

Dual-in-line integrated circuit units are conventionally mounted on printed circuit boards by the use of connectors or sockets having resilient contacts which are soldered to the p.c. boards in position to make detachable electrical connection to the i.c. terminals. Each contact is formed of a solderable, electrically conductive metal spring material and is secured in a recess in an electrically insulating connector body so that a post part of the contact extending from the bottom of the recess is easily fitted into a selected opening in a p.c. board to be soldered to a circuit path on the board and so that an i.c. terminal is easily inserted into the top of the recess to be detachably engaged with the contact. However, in some automatic assembly equipment the i.c. units are inserted into the sockets prior to wave soldering of the sockets to the p.c. board with the result that terminals of such i.c. units sometimes become soldered to the post part of the contacts thereby frustrating the detachable feature normally provided by the socket. In that regard, it would be desirable to provide a connector structure which is easily mounted on a p.c. board, one which can be soldered to the board whether or not i.c. units are already mounted while avoiding the possibility of the i.c. units being soldered to the contacts of the sockets, one which is adapted to receive different types of i.c. terminals with greater ease and versatility, and which provides greater ease and reliability in detachably mounting i.c. units on the p.c. board.

SUMMARY OF THE INVENTION

It is an object of this invention to provide a novel and improved connector for mounting integrated circuit units on a printed circuit board; to provide such a connector incorporating low cost, high quality single beam contacts formed from strip materials; to provide a connector in which such contacts are more easily and accurately positioned and received in recesses in a connector body to facilitate soldering of the contacts to a printed circuit board and to facilitate detachable engagement of integrated circuit terminals with the contacts; and to provide a connector in which the connector body has an improved low profile, has improved freedom from warping, and has recesses with an improved configuration to prevent unintended soldering of i.c. terminals to contacts.

Briefly described, the novel and improved connector of this invention comprises a connector body molded of a heatdeformable electrically insulating material such as a glassfilled polyester or the like and also includes a plurality of contact members which are formed from a strip of solderable, electrically conductive metal spring material.

Each contact member has a base part of a generally flat configuration. A single beam, spring part of the contact member extends up from one end of the base to loop over the base and a post part of the member extends down from the opposite end of the base.

The connector body preferably comprises a pair of spaced body sections which are secured in parallel relation to each other by ribs extending between the sections. Each section has a plurality of recesses located in a line therein and each recess is open at the bottom side of the section. An integrally formed stop member projects into the recess at the bottom side of the section. The single beam, spring part of the the contact can pass by the stop member during assembly of the contact into the recess. The stop member, which in one embodiment is shown essentially as a hinge element movable in one direction to facilitate passage of the contact and in a second embodiment is shown as a rigid member, serves to limit downward movement of i.c. terminals and to isolate the distal end portions of such terminals from solder material. The recess walls are of substantially the same thickness so that any tendency for the body to warp during temperature change is substantially reduced.

DESCRIPTION OF THE DRAWINGS

Other objects, advantages, and details of the novel and improved connector of this invention appear in the following detailed description of preferred embodiments of the invention, the detailed description referring to the drawings in which.

DESCRIPTION OF THE PREFERRED EMBODIMENT

Figure 1:
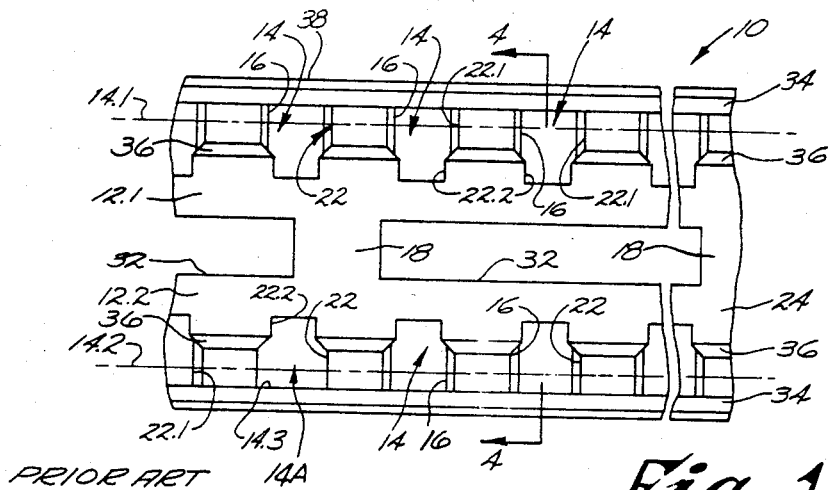
FIG. 1 is a plan view of a conventional connector.

Referring to the drawings, numeral 10 in FIGS. 1-4 indicates a connector which is shown to include a connector body 12 having a plurality of recesses 14 located therein and having a plurality of contact members 16 mounted in the respective recesses by selected deformation of portions of the connector body. For simplicity of illustration, FIGS. 1-4 illustrate portions of the connector body before and after deformation thereof and illustrate one body recess 14A with a contact member 16 omitted therefrom while showing contact members secured in the other body recesses by selected deformation of portions of the body.

The connector body 12 comprises a body of deformable, electrically insulating material such as glass-filled polyester or the like. The body material is selected so that the body has substantial rigidity to be strong and shape retaining during conditions of normal use but so that portions of the body are adapted to be selectively deformed by the application of heat or pressure or by ultrasonic fusing or the like as described below. The connector body 12 is preferably formed with two sections 12.1 and 12.2 held in spaced relation to each other by ribs 18 extending between the body sections. Groups of recesses 14 are located on lines 14.1 and 14.2 extending along the lengths of the respective sections. The body recesses 14 are each open at a bottom 20 of the body as shown particularly in FIG. 2 and terminal entry apertures 22 are arranged to open into the respective recesses through the top 24 of the connector body. The body sections may be proportioned as illustrated at 14B in FIG. 3 so that each wall of each of the recesses has substantially the same thickness, thereby to provide the body with improved freedom from warping when exposed to temperature or humidity changes.

The connector body provides steps 26 in each of the recesses 14 located at opposite sides of the recesses adjacent to the bottom 20 of the connector body and facing outwardly from the recesses. The connector body also has tower portions 28 which extend down from the bottom of the body between each pair of the recesses 14 and which also extend down from the body at the end of each of the lines of recesses 14.1 and 14.2. When a connector body is originally formed, the tower portions 28 are shaped or tapered as illustrated at 28A in FIGS. 2-4, preferably having an ogival shape or the like as shown. The tower portions are arranged so they extend into the recesses 14 and intercept the recess steps as shown particularly in FIGS. 2 and 3. The bottom of the connector body is also provided with spacer bosses 30 depending therefrom.

Figure 4:
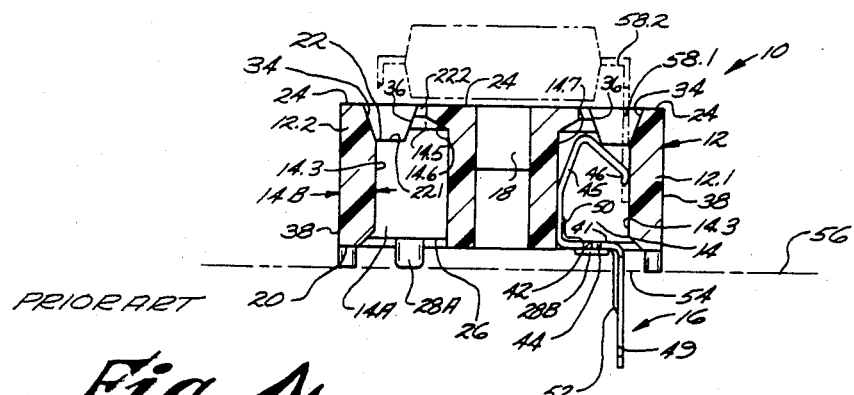
FIG. 4 is a section view along line 4—4 of FIG. 1.

The top 24 of the connector body 12 is generally flat and has a pair of guide surfaces 34 and 36 which extend along the length of each body section adjacent the outer edge 38 of the section in spaced parallel relation to each other. The guide surfaces of each pair taper into the body and taper toward each other as is best seen in FIGS. 1 and 4 to intercept each of the terminal entry apertures 22 in one of the lines 14.1 or 14.2 of the body recesses. Each of the terminal entry apertures 22 has a first part 22.1 which opens into a respective recess 14 adjacent a first wall 14.3 of the body recess at the outer side of the connector body. As is best shown at 14.4 in FIG. 3, the first part of the entry aperture extends across the full width of the recess 14. Each terminal entry aperture 22 also has a second part 22.2 of lesser width which extends centrally from the first part of the aperture into approximately the center of the recess 14. Preferably the top of the connector body inside each recess 14 is beveled or tapered toward the aperture 22 as indicated at 14.5 and 14.6 in FIGS. 2-4, thereby to center contact member 16 inserted into the recesses 14.

Figure 5:
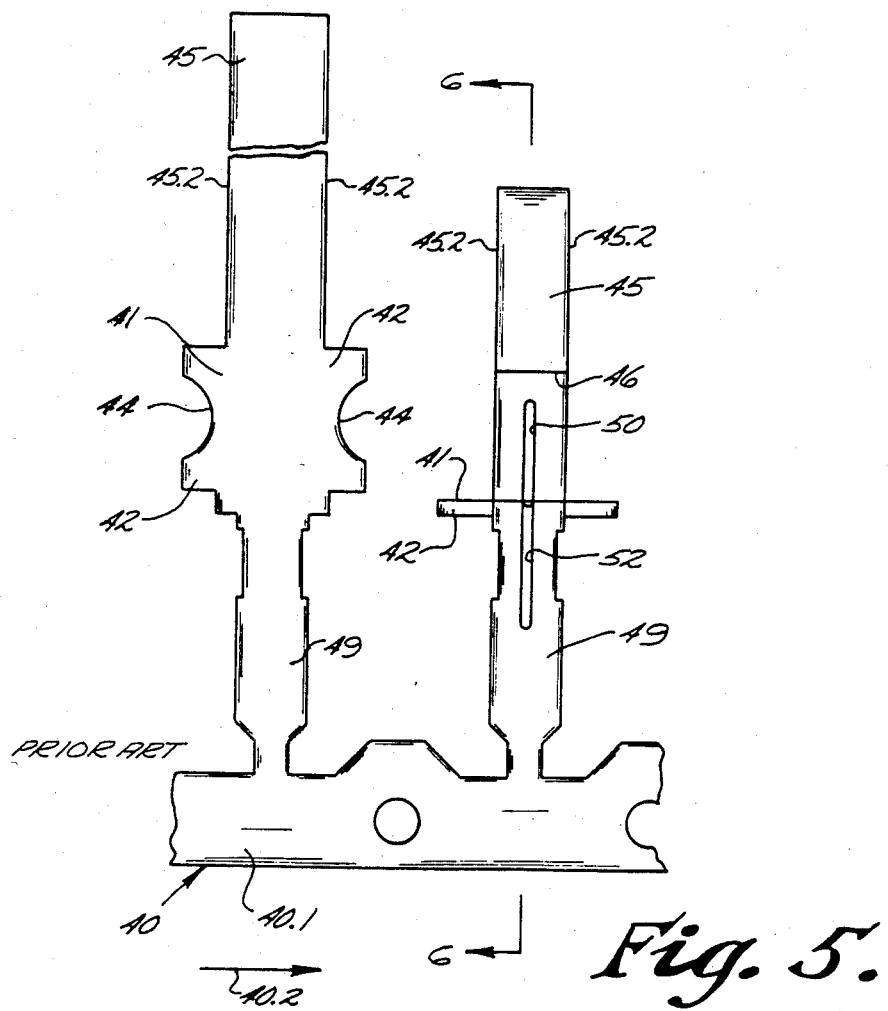
FIG. 5 is a side elevation view to enlarge scale of a strip of material used in forming contact members incorporated in the connector of FIGS. 1-4, the view illustrating steps in making of the contact members.
Figure 6:
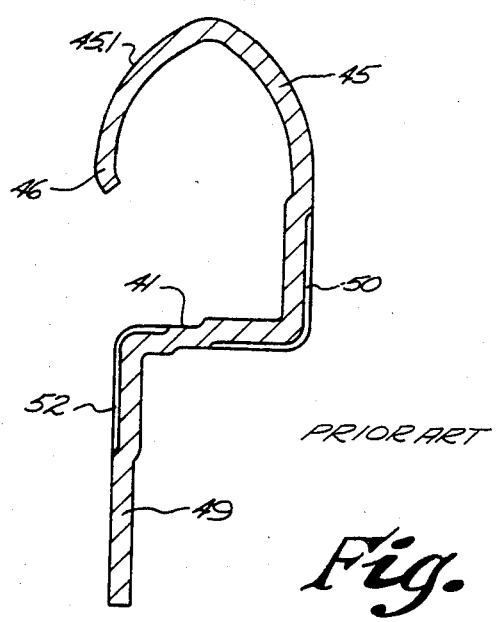
FIG. 6 is a partial section view along line 6—6 of FIG. 5 providing a longitudinal view through the contact member.

The contact members 16 are formed by blanking the members from a thin strip of solderable, electrically conductive, metal spring material such as phospher bronze or the like. Preferably as is diagrammatically illustrated in FIG. 5, the contact members 16 are blanked and progressively shaped from a metal strip 40 while retained attached to a skeleton or support portion 40.1 of the strip as the strip is advanced through progressive dies in a conventional manner as is diagrammically illustrated by the arrow 40.2 in FIG. 5. In that regard, each of the contact members is formed with a generally flat base part 41 which is provided with a winged portion 42 extending laterally from each side of the base. The wing preferably has an arcuate shape 44 formed therein at the distal end of the wing as is best shown in FIG. 5. The contact member is also provided with a spring beam part 45 which extends upwardly from one end of the base 41 to loop over the base part so that the distal end 46 of the spring beam is directed down toward the opposite end of the base. The contact member is also formed with a post part 49 extending downwardly from the opposite end of the base part. The strip material 40 embodied in the contact member is deformed to provide a stiffening rib 50 therein to extend into the base part and into a portion of the spring part of the contact member, thereby to position and hold the spring and base parts of the member in a desired angular relation to each other. Preferably a similar stiffening rib 52 is formed in the strip material extending into the base and into the post part of the member to hold the base and post part member in a desired angular relation to each other.

The looped spring beam parts 45 of the contact members 16 are proportioned to fit snugly into the body recesses 14 so that the distal ends 46 of the spring beam parts bear against the first recess walls 14.3 with selected predetermined force. That is, the loop 45 is oversized to a selected degree with respect to the recess 14 and accordingly, when the loop contact part 45 is fitted into the recess, the spring is prestressed to a selected degree. However, the arcuate shapes 44 of the contact base wings are engaged with the ogival shaped tower portions 28A of the body so that, when the base wings 42 are engaged with the recess steps 26, the contact is located in a predetermined position in the recess. Further, the stiffening rib 50 formed in the base and spring parts of the member assures that the base and spring parts of the contact have the desired angular relationship to each other. Accordingly, the prestress of the spring part 45 is properly applied against the recess wall 14.3 by the distal end 46 of the spring with a consistent predetermined force. The tower portions 28 of the body are then deformed over the contact wings 42 by the application of heat or pressure or by ultrasonic fusing or the like in any conventional manner as is best indicated at 28B in FIG. 4, thereby to secure the base wings 42 firmly against the recess steps 26. The stiffening rib 52 in the base and post parts of the contact members then assures that the post part 49 of the contact member extends from the connector body recess 14 at the proper angle to be readily received in a hole 54 in a printed circuit board 56 as is diagrammatically illustrated in FIG. 4.

Figure 2:
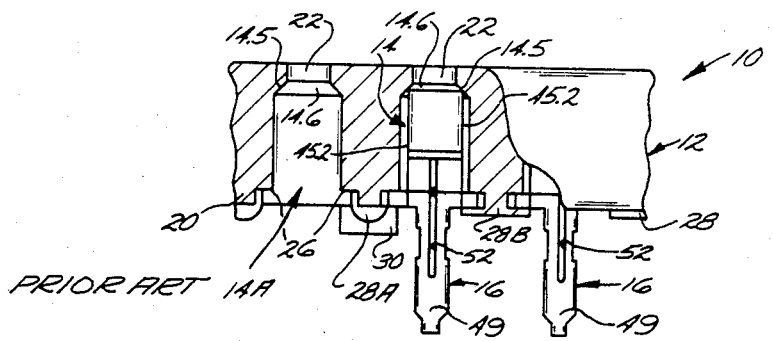
FIG. 2 is a partial side elevation view, partially in section, of the connector shown in FIG. 1.
Figure 3:
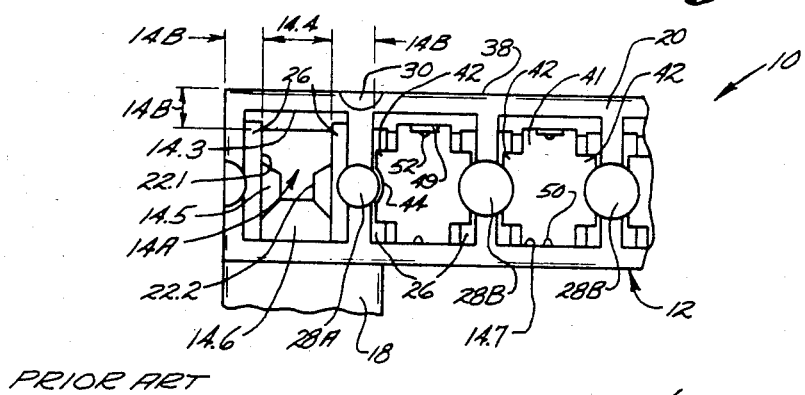
FIG. 3 is a partial bottom view of the connector shown in FIGS. 1 and 2.

In that way the connector 10 is adapted to receive an integrated circuit 58 of any conventional proportions on the flat top surface 24 of the connector body (see FIG. 4). The small i.c. terminals 58.1 of the unit are easily guided into the terminal entry apertures 22 by the tapered guide surfaces 34 or 36 which serve their desired function without adding unnecessary height to the connector body profile. The tip of the terminal is consistently engaged with the downturn portion 45.1 of the looped spring part as the terminal is inserted into the entry aperture part 22.2 to slide down against the recess wall 14.3 at the proper side of the contact 16. The distal end 46 of the spring is free to move downwardly to permit the terminal to be easily inserted with low insertion force between the distal end 46 of the spring and the first or outer recess wall 14.3, thereby to reduce risk of any terminal damage. The positioning of the contact members 16 in the recesses 14 as above described assures that the lateral edges 45.2 of the contact spring parts are free to move without interference with the walls of the recesses 14 as is best illustrated in FIG. 2. The spring part 45 applies a substantial contact pressure to the terminal 58.1 to assure that good electrical connection is made to the terminal. The arrangement of the stiffening rib 50 in a portion of the spring part 45 to rest against an inner or second wall 14.7 of the recess 14 assures that, when the terminal 58.1 is withdrawn from the aperture 22, the spring 45 maintains substantial force on the terminal during the withdrawal to avoid inadvertent dismounting of the i.c. unit. If the small i.c. terminals are relatively short so that the terminals are pressed downwardly to assure good electrical connections, the wider parts 22.1 of the terminal entry apertures assure that the usually wider terminal shoulder portions 58.2 are readily accommodated in the entry apertues 22. Thus, the connector 10 applies only low force to terminals being insert to permit easy insertion with reduced risk of terminal damage; assures that the terminal is properly positioned between the contact and the recess wall in the connector body; applies good contact force to make reliable electrical connection between the contact and the terminal; and maintains goods withdrawal forces to assure secure integrated circuit mounting.

Figure 7A:
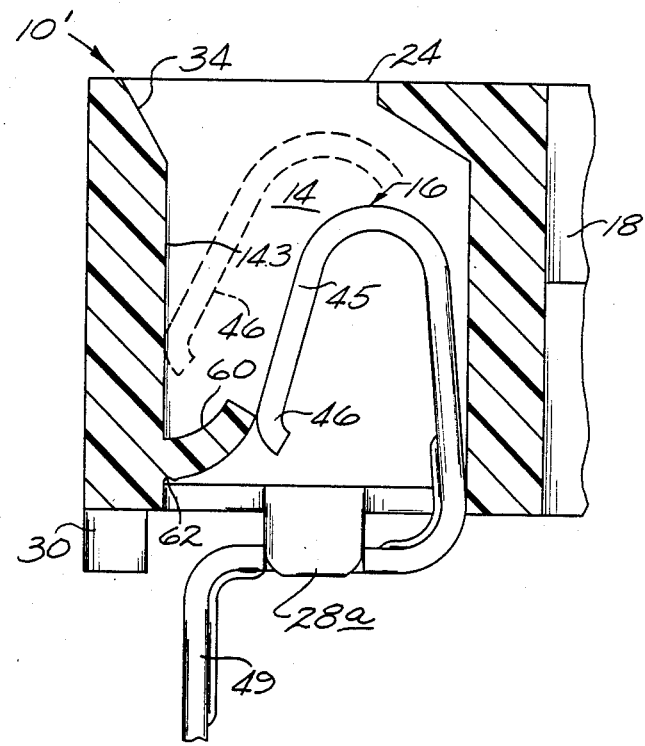
FIG. 7a is a section similar to FIG. 4 but to an enlarged scale and broken away to depict one recess provided with a stop member made in accordance with the invention, the Figure showing a contact member inserted part way into the recess
Figure 7B:
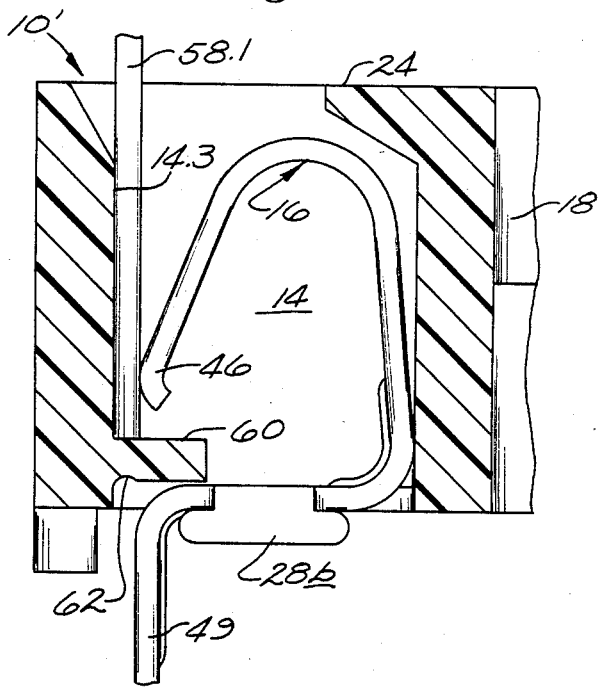
FIG. 7b is a view similar to FIG. 7a but with the contact fully seated in the recess and with an i.c. terminal received in the recess.

With particular reference to FIGS. 7a and 7b a connector 10' made in accordance with the invention is shown to include a stop member 60 formed integrally with wall 14.3 at the bottom of the body and projects into recess 14. FIG. 7a shows a transitional state of assembly wherein a contact member 16 has been inserted part way into recess 14. At that position the single beam spring 45 not only is squeezed so that distal end 46 is flexed closer to the upwardly extending portion of spring 45 but it also forces the free end portion of member 60 to move upwardly until distal end 46 passes by stop member 60 allowing it to return to its extended position limited by wall 14.3, as seen in dashed lines in FIG. 7a. Stop member 60 is preferably provided with an undercut portion 62 to facilitate hinge like motion of member 60. Once contact member 16 is fully seated in recess 14, tower 28A is deformed as shown at 28B. An i.c. unit terminal 58.1 can then be inserted into connector 10' with downward movement of the distal free end of terminal 58.1 being limited by the top surface of stop member 60. It will be noted that terminal 58.1 engages the stop member at an immovable portion thereof contiguous to wall 14.3. Further, the bottom surface of member 60 serves to isolate terminal 58.1 from any solder material which might otherwise come into contact with the terminal during wave soldering operations.

Figure 8A:
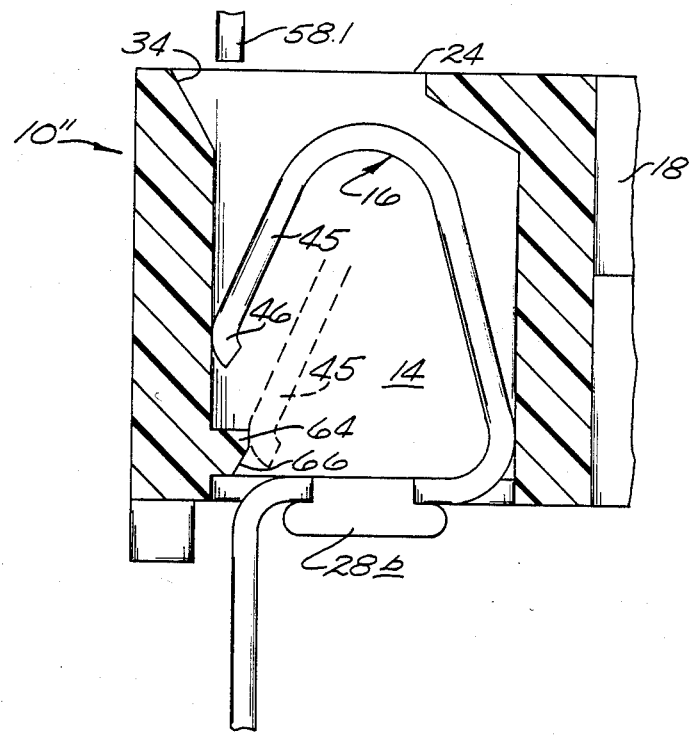
FIG. 8a is a view similar to FIG. 7a of another embodiment of the invention.
Figure 8B:
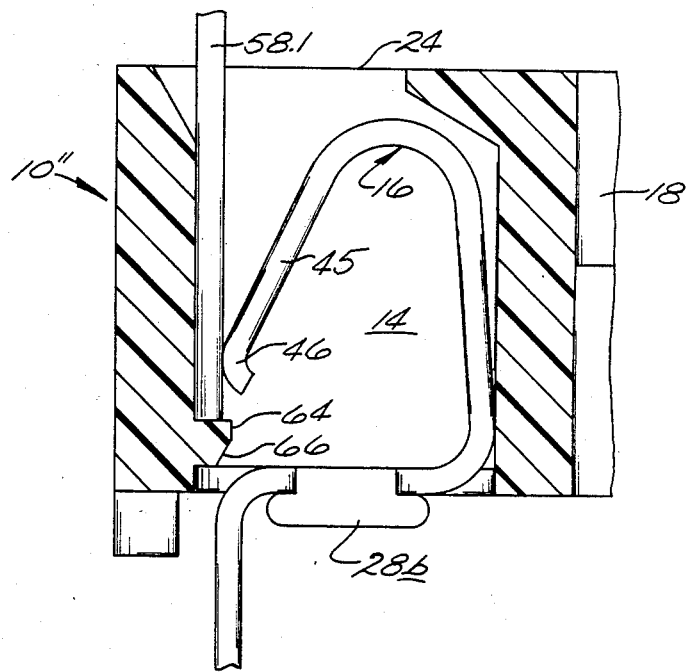
FIG. 8b is a view similar to FIG. 8a with an i.c. terminal received in the recess.

FIGS. 8a and 8b show another embodiment wherein a stop member 64 is formed integrally with side wall 14.3 of connector 10" in such manner that it is essentially rigid. In this regard, it may be formed so that it does not extend as far into recess 14 making it stubbier than stop member 60. Also, if desired, it may be made somewhat thicker than member 60. As seen in FIG. 8a, in dashed lines, spring beam part 45 is flexed as contact 16 is inserted into recess 14 until distal end 46 passes stop member 64 allowing distal end 46 to spring into engagement with side wall 14.3 Stop member 64 is preferably provided with a beveled bottom surface 66 to facilitate the initial flexing of spring part 45 during insertion of contact 16 into recess 14. FIG. 8b shows i.c. unit terminal 58.1 fully inserted with its downward movement limited by the top surface of stop member 64. In both embodiments the stop member projects into the recess substantially more than the thickness of the i.c. unit terminal to provide isolation from solder material.

It should be understood that although preferred embodiments of the connector have been described to illustrate this invention, the connector includes all modifications and equivalents of the described embodiments falling within the scope of the appended claims.

I claim:

1. A connector for mounting integrated circuit units on a printed circuit board comprising a body of substantially rigid electrically insulating material having a plurality of recesses arranged in a line therein and a plurality of electrically conductive metal spring contact members mounted in the respective recesses, the body having the recesses open at one end at a bottom of the body, and having terminal entry apertures opening into the opposite ends of the recesses through a top of the body, the contact members each having a horizontally extending base and a single beam spring part extending up into the recess from one end of the base to loop over the base to resiliently engage a distal end of the spring part with a first wall of the recess, and having a post part extending down out of the open recess end at the bottom of the body and from the opposite end of the base part, a stop member integrally formed with the body at the bottom projecting from the first wall into the recess a selected distance forming a flat surface extending generally 90° from the first wall, the stop member being located between said distal end of the spring part and said base and having a distal free end portion which is movable from an original position toward the top of the body to facilitate upward insertion of the contact members into the recess to a seated position, the distal free end portion adapted to move back to its original position once the contact member is seated within the recess, the stop member located to engagingly block excessive downward movement of i.c. unit terminals received through the terminal entry apertures.

2. A connector according to claim 1 in which the i.c. unit terminal has a given thickness and the stop member extends into the recess a greater distance than the given thickness.

3. A connector apparatus according to claim 1 in which the stop member has a bottom surface and a groove is formed in the bottom surface contiguous with said first wall to facilitate upward hinge motion of the stop member.

* * * * *